United States Patent
Banke et al.

(10) Patent No.: US 7,219,023 B2
(45) Date of Patent: May 15, 2007

(54) METHOD AND DEVICE FOR THE DETECTION OF FAULT CURRENT ARCING IN ELECTRIC CIRCUITS

(75) Inventors: Boris Banke, Wedel (DE); Hans-Hermann Petersen, Wedel (DE)

(73) Assignee: ESW-Extel Systems Wedel Gësellschaft fuer Ausruestung mbH, Wedel (DE)

( * ) Notice: Subject to any disclaimer, the term of this patent is extended or adjusted under 35 U.S.C. 154(b) by 0 days.

(21) Appl. No.: 11/284,221

(22) Filed: Nov. 21, 2005

(65) Prior Publication Data
US 2006/0109009 A1 May 25, 2006

(30) Foreign Application Priority Data
Nov. 19, 2004 (DE) .................. 10 2004 056 436

(51) Int. Cl.
*G06F 19/00* (2006.01)
(52) U.S. Cl. ..................................... 702/58; 324/76.11
(58) Field of Classification Search ................. 702/58, 702/62–64, 182–185, 188; 324/76.11
See application file for complete search history.

(56) References Cited
U.S. PATENT DOCUMENTS
6,625,550 B1  9/2003  Scott et al.
6,782,329 B2  8/2004  Scott
2002/0149891 A1  10/2002  Neiger et al.
2004/0042137 A1*  3/2004  Wong et al. .................. 361/42

FOREIGN PATENT DOCUMENTS
DE   698 13 842   1/1998
DE   199 53 354   5/2000
DE   100 17 238   11/2000
WO   WO 01/90767   11/2001

* cited by examiner

*Primary Examiner*—Edward Raymond
(74) *Attorney, Agent, or Firm*—Reed Smith LLP

(57) ABSTRACT

The invention is directed to a method and a device for detecting fault current arcing in electric circuits for consumers with relatively constant power consumption, particularly in onboard aircraft power supplies. The object of the invention is to find a novel possibility for detecting arc faults in electric lines of consumers with a relatively constant power consumption which appreciably reduces erroneous triggering of safeguards without compromising the reliability of switching off in the event that arcing actually occurs. This object is met, according to the invention, in that a voltage value is measured simultaneous with the current measurement, a ratio is formed of the current measurement values and voltage measurement values that are detected in parallel, and an indicator signal is generated for detected arcing when changes in the ratio of current measurement values and voltage measurement values exceed a predetermined threshold value.

39 Claims, 5 Drawing Sheets

METHOD AND DEVICE FOR THE DETECTION OF FAULT CURRENT ARCING IN ELECTRIC CIRCUITS

CROSS-REFERENCE TO RELATED APPLICATIONS

This application claims priority of German Application No. 10 2004 056 436.1, filed Nov. 19, 2004, the complete disclosure of which is hereby incorporated by reference.

BACKGROUND OF THE INVENTION a) Field of the Invention

The invention is directed to a method and a device for detecting fault current arcing in electric circuits for consumers with relatively constant power consumption, in particular for connected heating elements. The invention is applied for early detection of arcing resulting from insulation defects occurring in any voltage power supply at any power supply frequency, but particularly in onboard aircraft power supplies, due to high mechanical, chemical, electrical and/or thermal loading.

b) Description of the Related Art

Fault current arcing, or 'arc tracking', as it is called in English-language technical literature, is particularly dangerous above all in aircraft wiring for safety reasons.

The typical pattern is that insulation faults occur in the wiring of electrical consumers, particularly heating devices, due to pre-existing defects (penetration, e.g., by mechanical, chemical and/or thermal alternating loads), initiate arcing fire, and often destroy an entire area of the cable or consumer. Often, shunts (leakage currents) with an initially high impedance occur and—usually aided by electrolytically acting liquids—lead to wet arc tracking, as it is called, subsequently decrease in impedance over the course of time and, finally, result in high-energy short-circuit arcing. A set of problems arises in that the environment is severely compromised by a cable fire initiated in this way and explosive sequential faults can cause catastrophic air accidents.

Alternately, so-called dry arc tracking can also occur and (e.g., due to chafing of cable on sharp edges) can cause sudden low-impedance shunts (short circuits) that can lead to the same catastrophic results.

The chief problem in developing safeguards for controlling a very high-current load (e.g., an in-line heater) is that the initial currents of fault current arcs (hereinafter, for the sake of brevity, arcing) can be very small compared to the rated currents of the load in use. Tests in which the fault current of an electric arc initially has a value of $I_{eff}<50$ mA at a rated current of 3.5 A have shown that the fault current attained considerably higher current values within a short time during the course of the experiment. On the other hand, for purposes of early detection of fault arcing, it must also be considered that the availability of aviation equipment and aviation systems is very important and, therefore, false triggering of safety measures cannot be allowed to occur.

There are diverse publications that particularly address this subject in aviation and aerospace. However, no satisfactory solutions have yet been found. But there has been a concerted effort to develop a safeguard which detects the occurrence of arcing before the conventional overcurrent protection (which sometimes does not interrupt the current until after a cable fire has already started) and which turns off the defective load circuit already before the actual short circuiting and before the occurrence of greater damage.

For example, WO 01/90767 A1 describes a method and a device for detecting arc faults (arc tracking) in which an AC signal in a cable is sampled in discrete time and converted into a trigonometric function of the alternating current based on the discrete current signal by interpolating a determined quantity of sample values. The presence of leakage current arcing is determined by comparing the actual AC frequency determined in this way to a reference frequency. Interference caused by turn-on processes of other consumers is distinguished in that its decay behavior exhibits a different frequency pattern.

This solution is disadvantageous in that the signal interpolation of the frequency response—in order to be fast—can rely on only a few current measurement values. Also, the similarities to interference in frequent turn-on processes at the supply voltage still pose a relatively high risk of erroneous triggering of the safeguard. Further, the signal processing is relatively elaborate, easily subject to error, and can only reasonably be applied at all for AC power supplies with a known, constant power supply frequency.

DE 199 53 354 A1 discloses a device for detecting leakage current arcing, particularly in household circuits, which has an application-specific circuit (ASIC) based on current measurement and correlation of the actual current signal with a noise-free AC signal component in order to determine leakage current arcing from the correlation deviation and interrupt the circuit. The filtering for removing the noise component is carried out by digital signal processing using a standard processor unit (CPU). It is at least doubtful that interference caused by turn-on processes of other consumers can be safely distinguished from interference caused by arcing, so that erroneous triggering of the protective circuit cannot be ruled out.

A somewhat different approach is taken in the solution according to DE 698 13 842 T2, wherein the current in cable bundles of a household distribution system is monitored by means of a transformer and the rate of change of the current dI/dt is observed. A test signal representing a leakage current arc signal simulated by a signal generator is fed over the same transformer. Following a comparison of the signal changes, the number of times that a threshold value is exceeded is counted and, after a determined quantity, is used to trigger an interrupter signal.

In US 2002/0149891 A1, a detection signal for arcing is received, likewise over a transformer, and is analyzed along different filter paths. The continuous waveform is taken off as voltage from the secondary winding of the transformer and branched into two filter paths. In the first filter branch, the AC frequency component and, in the second filter branch, the high-frequency component of the transformer output are separated from the input signal, wherein the high-frequency component is used to determine the presence of leakage current arcing. For this purpose, the signals of the two filter paths are rectified after a two-stage filtering and are divided in peak signal values and average signal values, wherein particularly high peak values in one of the two filter branches leads to an immediate triggering of the protection circuit.

This method is disadvantageous in that it is only suitable for AC power supply and, in addition, presupposes a relatively low power supply frequency. The analog processing in the filter paths is complicated and relatively prone to interference signals so that erroneous triggering of the protection circuit cannot be ruled out with certainty.

A solution that was conceived specifically for aircraft and also for the 400-Hz power supply specific to aircraft is disclosed in DE 100 17 238 A1 (analogous to U.S. Pat. No.

6,625,550 B1; U.S. Pat. No. 6,782,329 B1). In this case, the protection circuit is triggered after a specific "current signature" of the usually very specific (almost standardized) consumers in an aircraft, wherein a rate of change of a circuit-characteristic signal is observed as input signal and, after signal processing steps in an ASIC by means of a microprocessor, a selection of signal characteristics typical of the consumer is filtered out so that only "current signatures" of the monitored circuit associated with those of leakage arcing lead to immediate triggering of the protection circuit.

This signal processing is disadvantageous in that the programming of consumer-specific "current signatures" requires the use of a processor and the large proportion of analog processing steps (integrator, bandpass filter, voltage zero crossing detection, determination of the proportion of high frequencies) increases the susceptibility of the detection circuit to interference.

All of the above solutions have in common that they evaluate substantially only a current-equivalent signal quantity of the monitored load circuit. High-impedance leakage current arcing is difficult to detect in this way and unnecessary erroneous triggering of the safeguard, which poses a danger vis-a-vis the safety requirements in aircraft, cannot be reliably excluded. Moreover, most of the known solutions comprise predominantly analog evaluating circuits, which are more prone to problems.

OBJECT AND SUMMARY OF THE INVENTION

It is the primary object of the invention to find a novel possibility for detecting arc faults in electric lines of consumers with a relatively constant power consumption which appreciably reduces erroneous triggering of safeguards, which is disadvantageous particularly in aircraft, without compromising the reliability of switching off in the event that arcing actually occurs.

In a method for detecting arc faults in which a current is measured in at least one line of a load circuit and a monitoring signal is generated using a converted current measurement value, wherein arcing is detected when at least one threshold defined for the monitoring signal is exceeded, the above-stated object is met, according to the invention, in that a voltage value is measured simultaneous with the current measurement, in that a ratio is formed of the current measurement values and voltage measurement values that are detected in parallel and an indicator signal is generated for detected arcing when changes in the ratio of current measurement values and voltage measurement values exceed a predetermined threshold value.

The resistance value of the load circuit is advantageously taken as a ratio of the current measurement values and voltage measurement values. However, the (reciprocal) conductance can also be formed from the current measurement values and voltage measurement values.

It has proven advantageous when the quantity of times that the predetermined threshold values for the ratio of current measurement values and voltage measurement values are exceeded is added over defined time intervals before an arc fault signal is generated.

In order to make the arcing detection method less susceptible to circuit-dependent isolated interference, a counter is preferably incremented by 'one' every time the predetermined threshold value is exceeded and is reset to zero at regular time intervals.

In another variant for reducing susceptibility to interference, a counter is advisably incremented by one counting value every time the predetermined threshold value is exceeded and is decremented by 'one' after defined regular time intervals or after defined time intervals that have elapsed without incrementation, wherein it is not further decremented at counting value 'zero'.

The time intervals for an at least partial decrementation of the counter are set at between 0.1 ms and 10 s, depending on the desired sensitivity, preferably for DC circuits. For AC voltage operated load circuits, the time interval for an at least partial decrementation of the counter is advisably between 1 and 1000 half-waves of an alternating voltage of the load circuit.

A particularly advantageous detection variant for AC circuits consists in that a counter is incremented when the threshold value for the current-to-voltage ratio is exceeded only when a voltage amount above a predetermined voltage threshold is measured at the same time within a half-wave of the AC voltage. In this connection, the counter can advisably be additionally decremented by a counting value when the threshold value for the current-to-voltage ratio is exceeded and, at the same time, the predetermined voltage threshold is not reached within a half-wave, because when a determined voltage level is not reached there is a high probability that the interference is not caused by arcing, but by some other disturbance.

In order to further reduce the influence of interference that is not the result of arcing, it has proven advantageous to carry out at least one of the following steps prior to forming the ratio of the current values and voltage values:

elimination of offset errors of the measured current signals and voltage signals by subtracting their mean values which were determined in a currentless state of the load circuit;

low-pass filtering of the current signals and of the voltage signals;

and for AC voltage operated load circuits:

phase compensation between current signals and voltage signals; and determination of the absolute values of the current signal and voltage signal.

Further, it is advantageous in an AC voltage operated load circuit that the ratio of current values and voltage values is formed from temporarily stored measurement values when the absolute value of the AC voltage of the load circuit (at the zero point of the voltage signal) does not exceed a predetermined lower threshold voltage, wherein the temporarily stored current values and voltage values represent the last signal state before the threshold voltage was not reached and are replaced by actual current values and voltage values only after the threshold voltage is exceeded again.

A constant value can advisably be used as threshold value for the evaluation of the ratio of current values and voltage values. A value determined empirically for the load circuit is preferably used for this purpose. However, it is particularly advantageous for evaluating the ratio of current values and voltage values to calculate a sliding threshold that is determined by applying a mathematical function to the continuously generated mean value of N preceding ratio values.

Further, the above-stated object is met in an arrangement for determining arc faults in load circuits, particularly in onboard power supplies in aircraft and spacecraft, in which a current sensor is arranged in at least one line of the load circuit, an analog-to-digital converter is arranged downstream of the current sensor for generating time-discrete sample values of a current signal, and a function unit is provided for evaluating selected sample values, for suppressing interference not caused by arcing, and for generating a fault signal when sample values are detected beyond a predetermined threshold, wherein, in addition to the current sensor, a voltage sensor is arranged in the line of the load circuit, in that a division element is arranged downstream of the current sensor and voltage sensor for forming ratio values from current values and voltage values that are measured at the same time, and in that an evaluation unit is arranged downstream of the division element for generating a fault signal for detected impermissible arcing, wherein the evaluation unit has at least one threshold evaluation unit for determined ratio values of current values and voltage values for generating a fault signal for detected arcing.

The division element is advantageously connected to the current sensor and voltage sensor in such a way that the ratio value is formed from the voltage value as dividend and from the current value as divisor, and the threshold evaluation unit has, at its output, a detection signal for potential arcing when the calculated ratio value fails to reach a predetermined resistance threshold.

Alternately, the division element is advisably connected to the current sensor and voltage sensor in such a way that the ratio value is formed from the current value as dividend and the voltage value as divisor, and the threshold evaluation unit has a detection signal at its output when the calculated ratio value exceeds a predetermined conductance threshold.

The evaluation unit advisably contains downstream at least one selective summing of the detection signals of the threshold evaluation unit based on a permissible frequency of occurrence of detection signals of potential arcing within predetermined time intervals and has a fault signal for detected arcing when the permissible frequency of occurrence is exceeded. The evaluation unit preferably contains at least one counter arranged downstream of the threshold evaluation unit, wherein the threshold evaluation unit has a detection signal when the ratio value exceeds a predetermined threshold value and is applied to an incrementing input of the counter.

There are different possible variant solutions for the selective summing of detection signals of potential arcing.

In a first variant, the counter has a reset input which communicates with a gate circuit so that the counting value of potential arcing is set back after the expiration of defined time intervals of the gate circuit.

In a second variant, the counter is advantageously a forward/backward counter and has a decrementing input that is connected to a gate circuit so that the counter is decremented by an increment after the expiration of defined time intervals.

In a third variant for AC voltage operated load circuits, the gate circuit advisably communicates with a zero crossing detector for detecting half-waves of the AC voltage so that the counter is decremented by at least one increment after a predetermined quantity of half-waves.

In addition, the gate circuit can communicate with the output of the threshold evaluation unit so that the counter is decremented by at least one increment or reset to zero after a predetermined quantity of half-waves in which no incrementation is carried out by the threshold evaluation unit. However, a decrementation of this kind can also be carried out in spite of incrementation that has been effected within the predetermined quantity of half-waves after the expiration of the predetermined time interval to reduce the sensitivity of the arc detection.

In a fourth variant for AC voltage operated load circuits, the gate circuit communicates with an additional threshold switch which has an H-signal when a voltage threshold is not reached in the zero crossing region of the AC voltage, which H-signal is conjunctively linked to the output of the threshold evaluation unit for the ratio value, so that the counter is decremented by at least one increment when there is a detection signal of the threshold evaluation unit and the H-signal of the threshold switch of the voltage threshold.

Preferably at least the division element and the evaluation unit are integrated on an FPGA. Alternatively, they can also advisably be integrated on an ASIC. Further, additional elements such as current sensors and voltage sensors and any signal pre-processing units that may be optionally provided in front of the division element can be integrated on the FPGA or ASIC.

An electric switch which is provided for interrupting the line of the load circuit when the evaluation unit has a fault signal for detected arcing is advantageously arranged near the power supply in the line of the load circuit which is monitored according to the invention. An electric switch for interrupting the feed to the load circuit can advantageously be an electronic switch (thyristor, triac, etc.) or an electromechanical relay.

For applications in aviation and aerospace, it has proven advantageous when the current sensor with associated analog-to-digital converter, the voltage sensor in the form of the analog-to-digital converter, and a function module containing the division element and the evaluation unit are integrated in a compact protection switch whose switching function disconnects a monitored line from the power supply when the evaluation unit generates a fault signal for detected arcing.

The invention is based on the essential idea that the detection of leakage current arcing in load circuits is hampered by sufficiently many similar current fluctuations such as interference caused by turning on and turning off other consumers and cannot be reliably carried out solely on the basis of current signal monitoring—even when using expensive filtering methods—without having to tolerate erroneous shutdown of the circuits which is unnecessary and impermissible in view of the safety requirements in aircraft and spacecraft. The invention is based on the insight that besides the normal load current there are other currents flowing through the conductor of the load circuit due to the occurrence of arc faults (arc tracking). This changes the ratio of voltage to current that is calculated by division after every current measurement and voltage measurement. Alternately, the ratio can be calculated as resistance or as conductance of the electric load.

Potential arcing (temporary interference which need not be caused in every case by fault current at high-impedance shunts) is advantageously detected in the load circuit and the latter is not turned off until this interference is repeated, e.g., in a determined quantity per time interval.

The type of power supply of the load makes no difference as regards the arcing detection according to the invention. The load can be operated by DC voltage or any AC voltage or even with variable frequency (accordingly also in a wild frequency power supply), the only precondition for the reliability of the arcing detection being that the load is not subjected to any fast changes in resistance in the monitored circuit.

Normal power supply interference can be better detected by combined evaluation of current and voltage, and AC curves can be sampled and processed very quickly when using FPGA technology (or ASICs). Because of the processing speeds required, conventional processor technology cannot reasonably be used.

With the solution according to the invention it is possible to appreciably reduce the risk of false triggering of safeguards when leakage current arcing is detected in electric lines for loads with relatively constant power consumption without impairing the reliability of shutdown in the event of actual arcing.

The substantial advantage consists in that fluctuations of the power supply voltage (e.g., for turning on other consumers) are not erroneously reported as arcing because the ratio of voltage to current in the former case does not change significantly. Another advantage consists in that the invention is suitable for DC voltage systems (i.e., systems in which the loads are supplied by DC voltage) as well as for AC voltage systems with variable or fixed frequencies.

The invention will be described more fully in the following with reference to embodiment examples.

DESCRIPTION OF THE PREFERRED EMBODIMENTS

Figure 1:
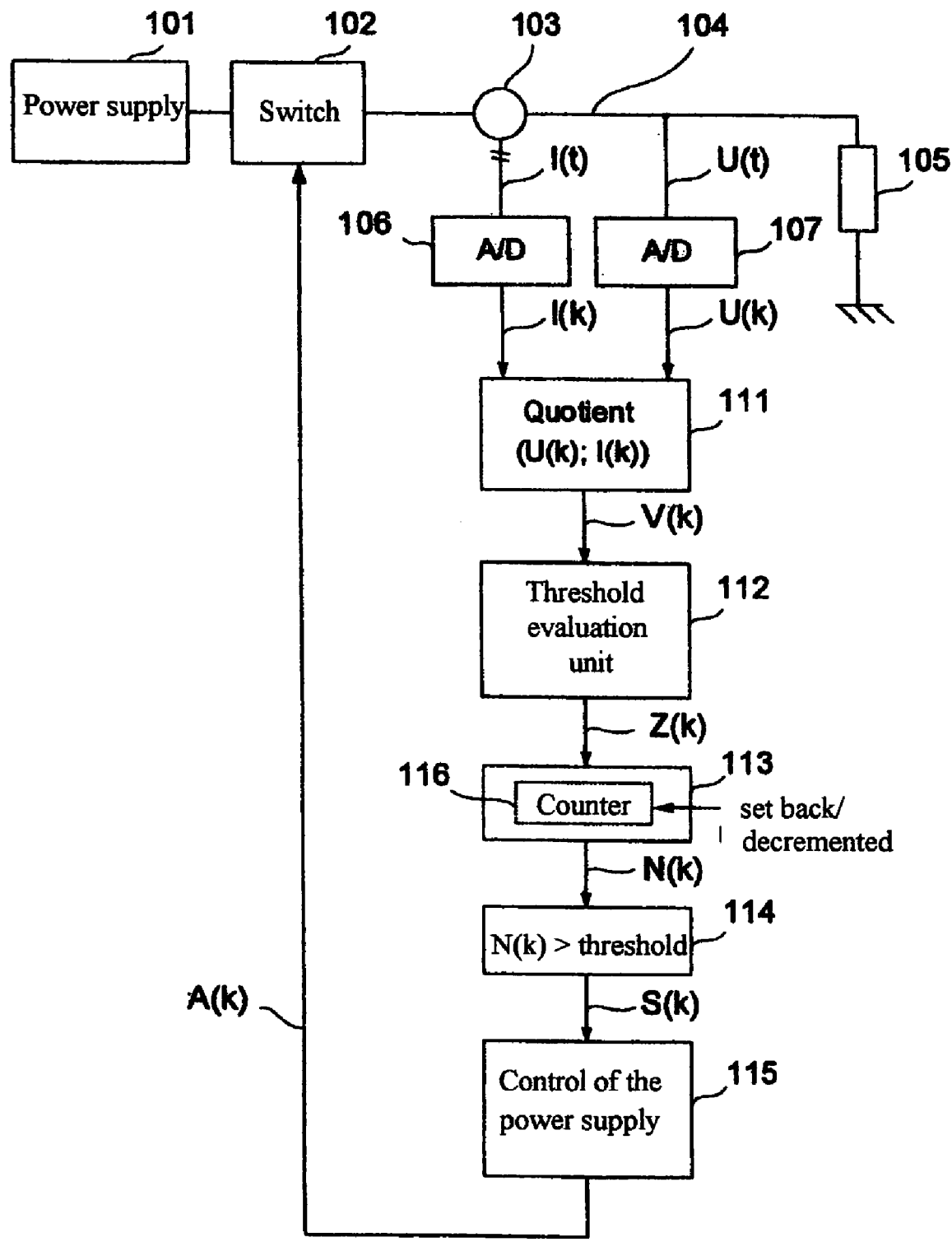
FIG. 1 shows a schematic of the arrangement according to the invention.

FIG. 1 shows a basic arrangement of a load circuit of any type for realizing the method according to the invention. The load circuit comprises a power supply 101, a switch 102 used for line interruption, a load 105 (e.g., a high-current heater), and an electric line 104 for supplying current to the load 105 (the current return is assumed to be a ground contact at the load 105). It is assumed that the line 104 is connected to an electric load 105 whose resistance does not change or changes only slowly.

A current sensor 103 followed by an A/D converter 106 and a voltage sensor in the form of an A/D converter 107 are arranged on the line 104 for detecting fault current arcing. Time-discrete current values I(k) and voltage values U(k) are provided synchronously at the outputs of the A/D converters 106 and 107 and are processed in a division element 111 to form an actual ratio value V(k). In so doing, either the resistance or the conductance of the load circuit can be calculated. In every case, an equivalent result is produced when the subsequent threshold evaluation unit 112 is correspondingly adapted.

When a predetermined threshold is exceeded (i.e., exceeded for a conductance value, not reached for a resistance value), the threshold evaluation unit 112 sends a detection signal Z(k) which is summed in determined time intervals in a gate circuit 113. A counter 116 which is integrated in the gate circuit is incremented by 'one' per detection signal Z(k) and, after the expiration of the given time interval, is reset or at least decremented by 'one'. The actual counting value N(k) of the counter 116 is constantly sampled by a comparator 114 which delivers a fault signal S(k) when a threshold for the permissible potential arcing within a time interval (embodied by the counting value N(k) of cumulative detection signals Z(k) for potential arcing) is exceeded. This fault signal S(k) causes a control unit 115 for controlling the power supply of the load circuit to send a cutoff signal A(k) to a switch 102 which disconnects the power supply 101 from the load circuit.

Figure 2:
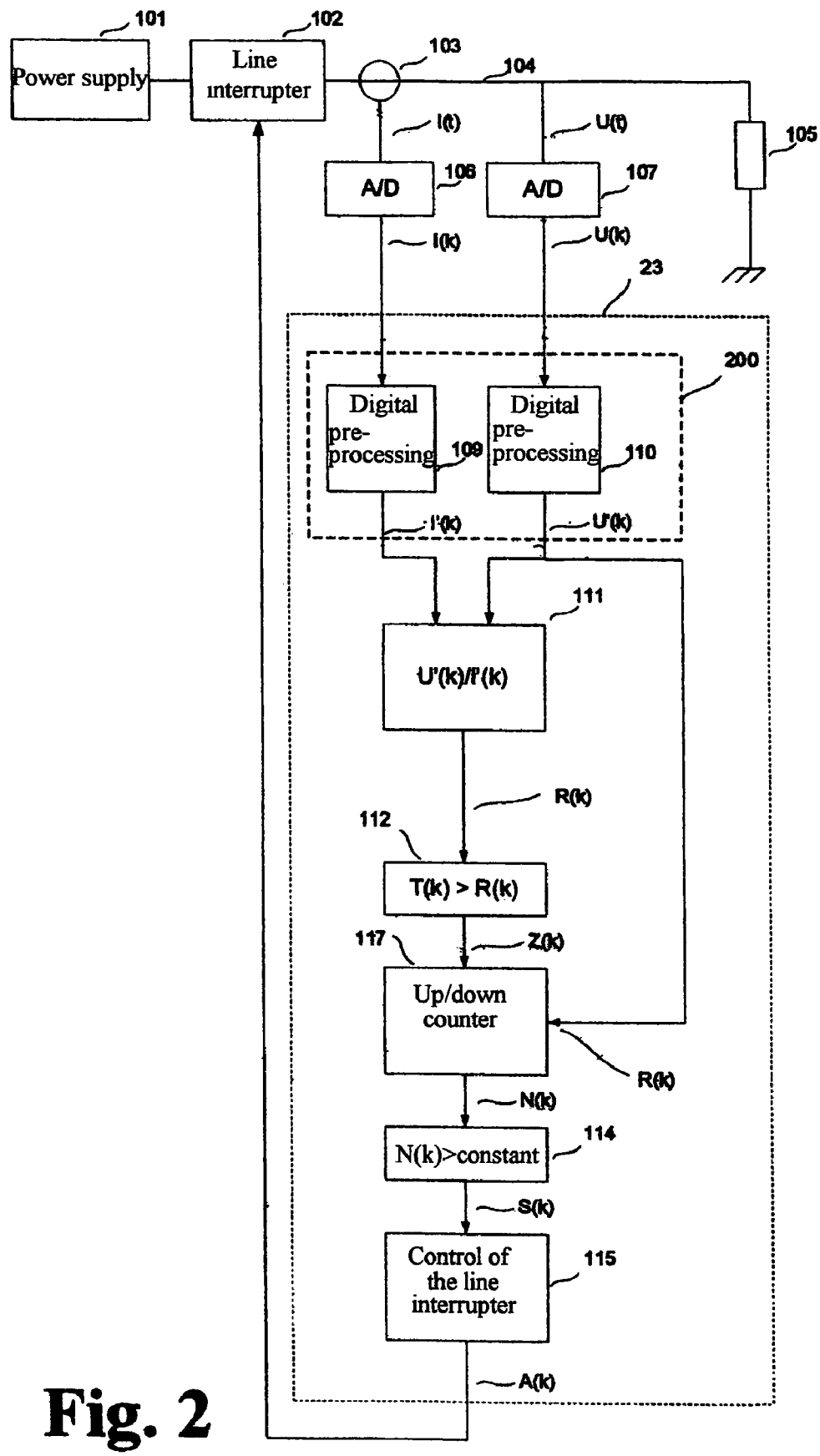
FIG. 2 shows a circuit diagram for realizing the method, according to the invention, with resistance measurement and resistance evaluation.

As is shown in FIG. 2, the current I(t) and the applied voltage U(t) in the line 104 are detected using this fundamental principle. For measuring current, a current transformer is used as current sensor 103. However, a current/voltage transformer can also be used. The current signals and voltage signals are sampled simultaneously with a sufficiently high frequency f=1/T, e.g., 100 kHz, by means of two analog-to-digital converters 106 and 107. The sampled signals are U=U(k/f) and I(k)=I(k/f), where k is a positive whole number.

The signals U(k) and I(k) are further processed digitally. A fast function module 23, preferably an FPGA (Field Programmable Gate Array), is used for this purpose because very large amounts of data must be processed within a short time in this method. Alternately, the digital data processing can be carried out in an ASIC (Application Specific Integrated Circuit).

When there is interference in a DC voltage system or in an AC voltage system, the sampled signals are worked up in a digital signal pre-processing block 200 as will be described in more detail referring to FIG. 3. The voltage signals and current signals which are "filtered" (i.e., pre-processed) in the signal pre-processing units 209 and 210 are designated U'(k) and I'(k) in FIG. 2. When there is no interference in the DC voltage system, the pre-processing is not required. In this case:

$$U'(k)=U(k)$$

and $$I'(k)=I(k).$$

In the present example, the actual resistance R(k)—as a concrete representation of the ratio value V(k) from FIG. 1—is calculated in the division element 111 (quotient former) as $$R(k)=U'(k)/I'(k)$$

by dividing the "filtered" voltage values U'(k) by the "filtered" current values I'(k).

The threshold evaluation unit 112 compares the actual resistance value R(k) with a threshold value T(k). In the simplest case, T(k) is a constant or an empirical value selected by the user.

When R(k) is less than value T(k), this is interpreted as the occurrence of "potential arcing" and the status signal Z(k) obtains the value '1' for the length of one cycle, whereas it is otherwise '0'. Z(k) is conveyed to the next unit which is responsible for controlling the supply of power to the load circuit.

In order not to generate a fault report in the event of interference on the conductor 104 that was erroneously detected as potential arcing and conveyed by sending a detection signal Z(k), a "genuine arcing" message is only generated when a determined quantity of potential arcing incidents has been detected within a predetermined space of time.

This is implemented in a gate circuit 113 by a simple time window in that a determined quantity N(k) of signals (for identifying potential arcing events exceeding the threshold) is passed and summed, or by a forward/backward counter 117, wherein a comparator 114 is caused to deliver a "genuine arc fault" (status signal S(k)) when a determined counting value N(k) is reached.

The counter 117 can be adjusted in such a way that it counts potential arcing in predetermined time intervals and is reset to zero at the end of every time interval. In a preferred embodiment, the counter 117 is constructed in such a way that its counting value N(k) is incremented with each potential arcing and is decremented by at least one after a predetermined time. Accordingly, when, after a series of potential arc characteristics are detected, no further events of this kind are observed, the counting value N(k) gradually decreases again after defined intervals (possibly to zero and remains there) until new potential arcing is detected.

When the counting value N(k) at the output of the gate circuit 113, which in this case is embodied only by the up/down counter 117, reaches or exceeds a predetermined constant, the comparator 114 sets an arc fault signal (value 'one'), wherein the fault signal S(k) represents a quantity of summed potential arcing events (detection signals Z(k)) within a predetermined time which represents a highly probable "genuine arc fault" in the load circuit. Otherwise, S(k) has the value of zero.

By using a counter 117 with a time window as gate circuit 113, isolated erroneous decisions based on other types of interference cannot lead to the generation of a fault signal S(k) for arc tracking. This advantage becomes even greater when the forward/backward counter 117 is decremented by individual counting values due to determined events or time interval limits as will be explained in more detail in the following.

The fault signal S(k) is sent to the control unit 115 which stores the fault and by setting the turn-off signal A(k) causes the corresponding conductor 104 at which the arcing of the load circuit were measured to be disconnected from the power supply 101 by a switch 102. The switch 102 can be an electronic switch (thyristor, triac, etc.) or an electromechanical relay.

Alternately, the turn-off signal A(k) can also be sent to a protection switch (not shown) which disconnects the conductor 104, and accordingly also the load 105, from the power supply 101.

Figure 3:
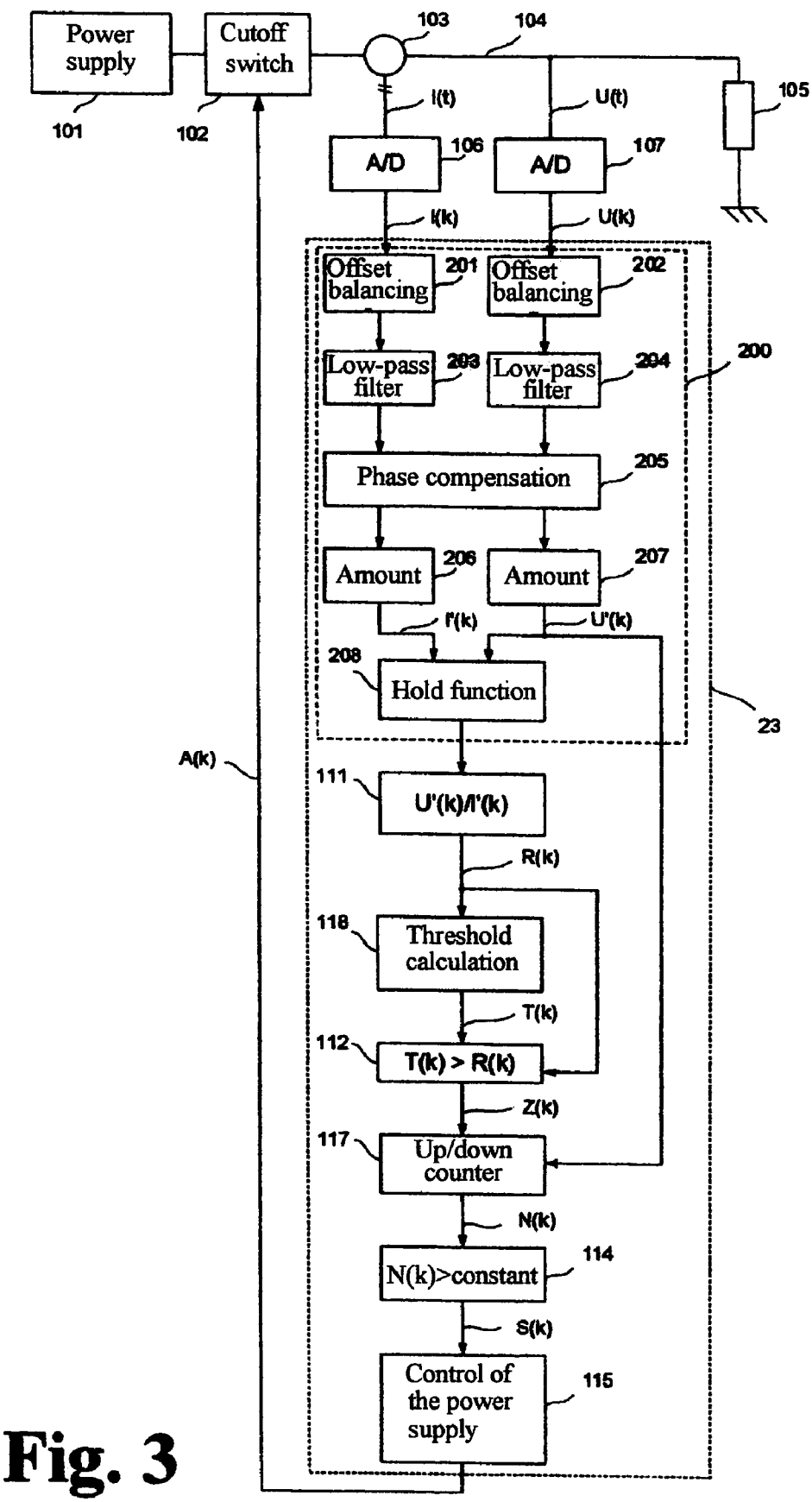
FIG. 3 shows a circuit diagram of an advantageously expanded arrangement applying resistance measurement.

As is shown in FIG. 3, the fundamental principle described above can be expanded by other operation steps to adapt it to different system requirements. This includes two offset balancing units 201 and 202, two low-pass filters 203 and 204, a phase compensation unit 205, two absolute value units 206 and 207, a hold circuit 208 for bridging signals below a voltage noise threshold, and a calculating unit 118 for determining a dynamic threshold for the potential arcing. In contrast to FIG. 3, these additional steps can also be employed individually with the actions described below in order to more reliably prevent erroneous triggering of the arc fault status signal S(k) due to other fluctuations of current and voltage.

The following expanded operations for data pre-processing are carried out following the analog-to-digital conversion of the current signals and voltage signals in the separate A/D converters 106 and 107 and prior to the forming of ratios in the division element 111.

Offset errors are corrected by an offset balancing units 201 and 202, respectively, for the sampled current signal I(k) and the sampled voltage signal U(k). For this purpose, the line 104 to the load 105 is disconnected from the power supply 101 after the system is started in order to calculate a mean value for each of the two sampled signals. After the power supply 101 is reconnected to the conductor 104, the calculated mean values are continuously subtracted from the actually sampled signals and then conveyed to the next processing step. An offset balancing unit of this kind is known, per se, from the prior art.

In order to reduce interference on the current signals and voltage signals, the two signals U(k) and I(k) which are sampled simultaneously and which have already been worked up by the offset balancing units 201 and 202 are filtered, respectively, by a low-pass 203 and 204. These low-passes 203 and 204 are digital FIR filters (Infinite Impulsed Response Filters) or IIR filters (Finite Impulse Response Filter) which are generally known. The filter coefficients are selected in such a way that most of the interference is removed but the characteristics of the arcing are retained.

The invention can be further supplemented in that an additional element, a phase compensation unit 205, compensates a possible phase displacement between the current and voltage in front of the division element 111 when a complex load and an AC voltage supply are used. In the phase compensation unit 205, the time difference of the zero crossings of the current signals and voltage signals are measured. The zero crossings are detected by simple comparators and the quantity of cycles between these zero crossings is measured by counters. The "faster" signal is then delayed corresponding to the time difference (e.g., by means of shift registers). The length of the shift register that is used is adapted dynamically corresponding to the required delay. After the phase compensation unit 205, the signals are conveyed to the next operation (quotient forming) in the division element 11.

When the power supply for the load provides AC voltage, the absolute amount of the sampled and, as the case may be, pre-processed current signals and voltage signals is formed by operation blocks, the absolute amount units 206 and 207, which are arranged in between in addition in front of the division element 111 to facilitate further processing. The processed signals are then fed to the division element 111. Optionally, they can be conveyed beforehand to a hold element 208 whose function will be described in the following.

In AC voltage systems, inaccuracies can result in the vicinity of the zero crossings of the sampled voltage signal in the subsequent calculations because the values of the pre-processed current signals and voltage signals are very small and, naturally, also zero. This is prevented by the hold element 208 in which the values of the two signals are "held" in the temporal vicinity of these voltage zero crossings. This is realized in that the voltage values and current values that have already been processed are stored in a register and made available when the absolute amount of the voltage fails to reach a predetermined level (lower voltage threshold). As long as this level of voltage is not reached, the subsequent division element 111 works with the values stored in the hold element 208, otherwise it works with the actual pre-processed signal values. The signals which are worked in this way are designated in FIG. 2 and FIG. 3 as U'(k) and I'(k) and are further processed in the division element 111 as was described.

In another embodiment of the method, the counting value N(k) of the counter 115 in the gate circuit 113 in AC voltage systems is decreased whenever potential arcing is observed in the temporal vicinity of the zero crossings of the voltage signal U(k). In these areas, there is generally no arcing because the voltage is too low at the start of a half-wave to allow arcing to occur and the arc is extinguished at the end of a half-wave before the voltage reaches zero. When potential arcing is detected in this area nonetheless, there is a very high probability that there is interference in the voltage signal or current signal, and the counting value N(k) in the counter 115 should not rise, but should decrease.

This is realized in that the processed voltage signal U'(k) is compared to a given lower threshold. When the voltage U'(k) is less than the voltage threshold value and the counting value N(k) of the counter is greater than 'one' and potential arcing has been detected (Z(k)=1) simultaneously, the counter is decremented. However, when U'(k) increases again and is no longer less than the threshold value, the counting value N(k) is incremented for every instance of potential arcing and is always decremented after a predetermined time. The time interval after which decrementation is carried out in order to protect the load circuit against premature and unnecessary disconnection of the power supply can be selected between 1 ms and 10 s or between 1 and 1000 half-waves of the AC voltage depending on the desired sensitivity of the system. It has proven advisable to use fewer half-waves for onboard aircraft power supplies (e.g., 400 Hz). The counting value of the up/down counter 117 especially is decremented by 'one' after every half-wave.

In AC voltage systems, the counting of fault current arcing can also take place depending on the half-waves of the AC voltage; that is, the up/down counter 117 is incremented in the gate circuit 113 exactly one time after every half-wave when one or more arcing events have occurred within this time, and the up/down counter 117 is decremented one time for every mth half-wave, where m is a natural number and a measure for the selected sensitivity of the arcing detection. The start and end of every half-wave is determined by detecting the zero crossings of the voltage signal U(k). The up/down counter 117 can be decremented or reset selectively either only after m half-waves in which no arcing has occurred or in a predetermined manner after m in every case.

In another embodiment of the invention, a fixed value (constant) is not associated with the threshold value T(k), but rather the threshold value T(k) is recalculated by a calculation unit 21 with each newly entered ratio value V(k), in this example (according to FIG. 3) with every resistance value R(k). For this purpose, the mean value $$R'(k) = \frac{1}{N}\sum_{i=0}^{N-1} R(k-i)$$

is formed continuously by the last N values of the actual resistance R(k), where N is a natural number and is selected in such a way that the calculated value R'(k) changes only negligibly when R(k) deviates briefly from its usual value.

With a function F, the threshold value T(k)=F(R'(k)) is calculated from R'(k). In this connection, F(R'(k)) must be selected in such a way that T(k)=F(R'(k)) in the relevant range is greater than 0 and less than R'(k) itself.

The greater the difference between R'(k) and T(k), the less sensitive the described method to fluctuations of the actual resistance. This dynamic threshold value T(k) has the advantage that it adapts itself in case the resistance of the load 105 changes or when permanent interference occurs on the line 104. This prevents false reports for arc tracking detection which is a frequent occurrence in some known systems. Further, the resistance of the load can be any size with this method.

Figure 4:
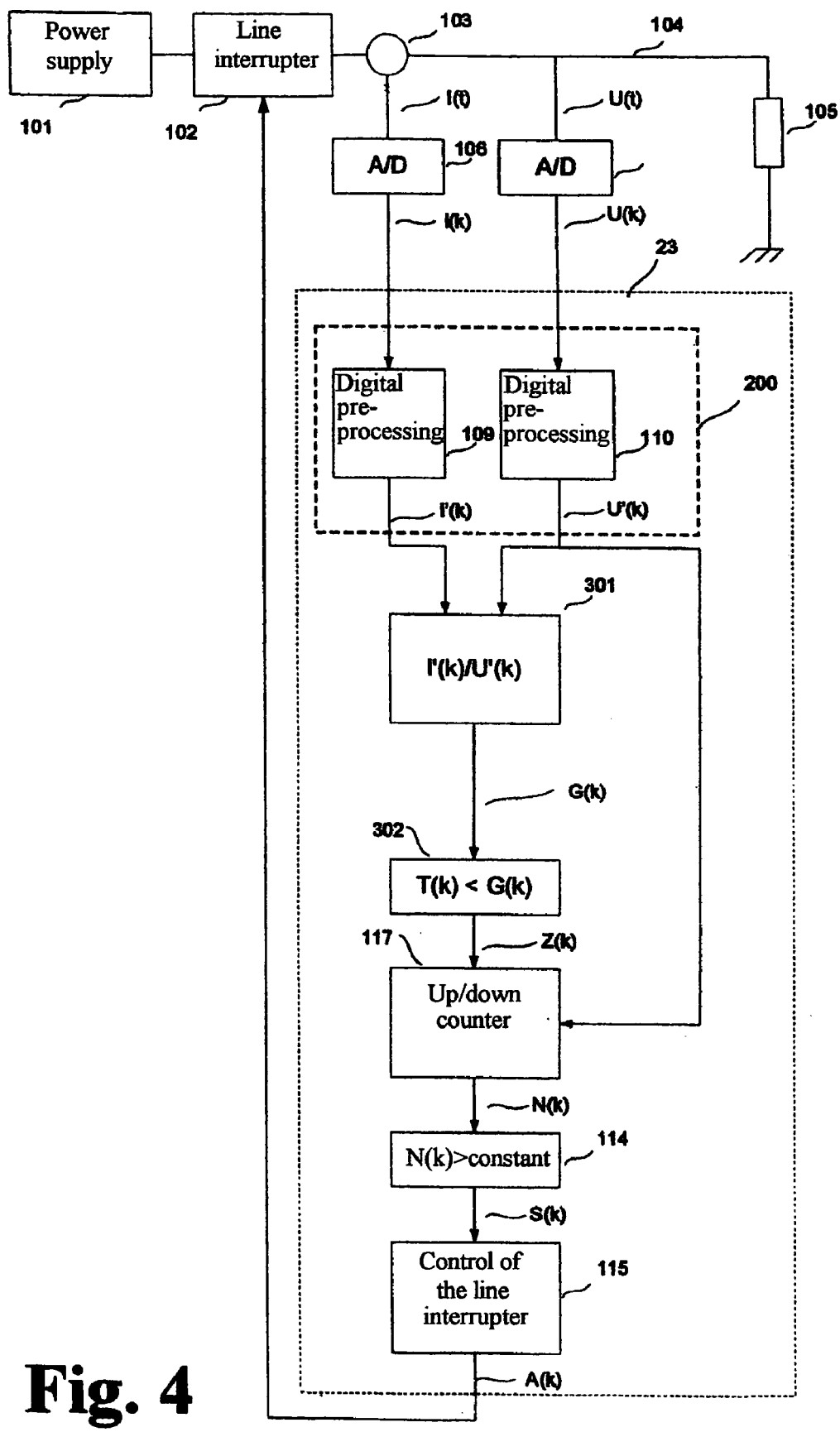
FIG. 4 shows an expanded circuit diagram in another variant of the method (conductance measurement)

A method for arc tracking detection very similar to that described above is realized in another embodiment form according to FIG. 4, wherein the division element 111 (from FIGS. 2 and 3) for calculating the resistance R(k) has been replaced by a quotient former 311 for calculating the actual conductance G(k)=U'(k)/I'(k). When the actual conductance G(k) exceeds the threshold value T(k) in the threshold unit 312, this is interpreted correspondingly as potential arcing and the status signal Z(k) obtains the value 'one' for the length of a cycle, whereas it is otherwise zero.

T(k) is a value greater than the normal conductance G(k) when no arcing occurs. Therefore, a function F for the dynamic threshold calculation (which would have to run in a threshold calculation unit 118 arranged analogous to FIG. 3) would have to be selected in such a way that this condition is met. The dynamic threshold T(k) is then T(k)=F(G'(k)), where G'(k) is the running calculation of the mean value of G(k).

In other respects, all operations using the conductance G(k) correspond to the method described above with reference to FIGS. 2 and 3 with resistance value R(k) and the sliding resistance value T(k)=F(G'(k)).

The digital signal processing in its entirety is preferably integrated—as is shown in FIGS. 2 to 4—in a function module 23 which can be an FPGA (Field Programmable Gate Array) or an ASIC (Application Specific Integrated Circuit). In addition to the digital signal processing, the analog-to-digital converters 106 and 107 as well as other components can also be integrated. For its own part, the function module 23 can be a component part of a protection switch. FPGA and ASIC, as function module 23, have the decisive advantage that they can carry out many operations simultaneously, enabling very fast data processing. The sampling of a plurality of analog signals with a frequency greater than 50 kHz, simultaneous filtering of the signals with different "filters" in the digital signal pre-processing block 200, and the simultaneous execution of other functions of the algorithm are difficult to realize with conventional processors.

Additional functions, e.g., an interface by which to communicate with other components, can be integrated in the function module 23. In this way, fault reports and details concerning a control unit can be displayed and parameters can be received.

Figure 5:
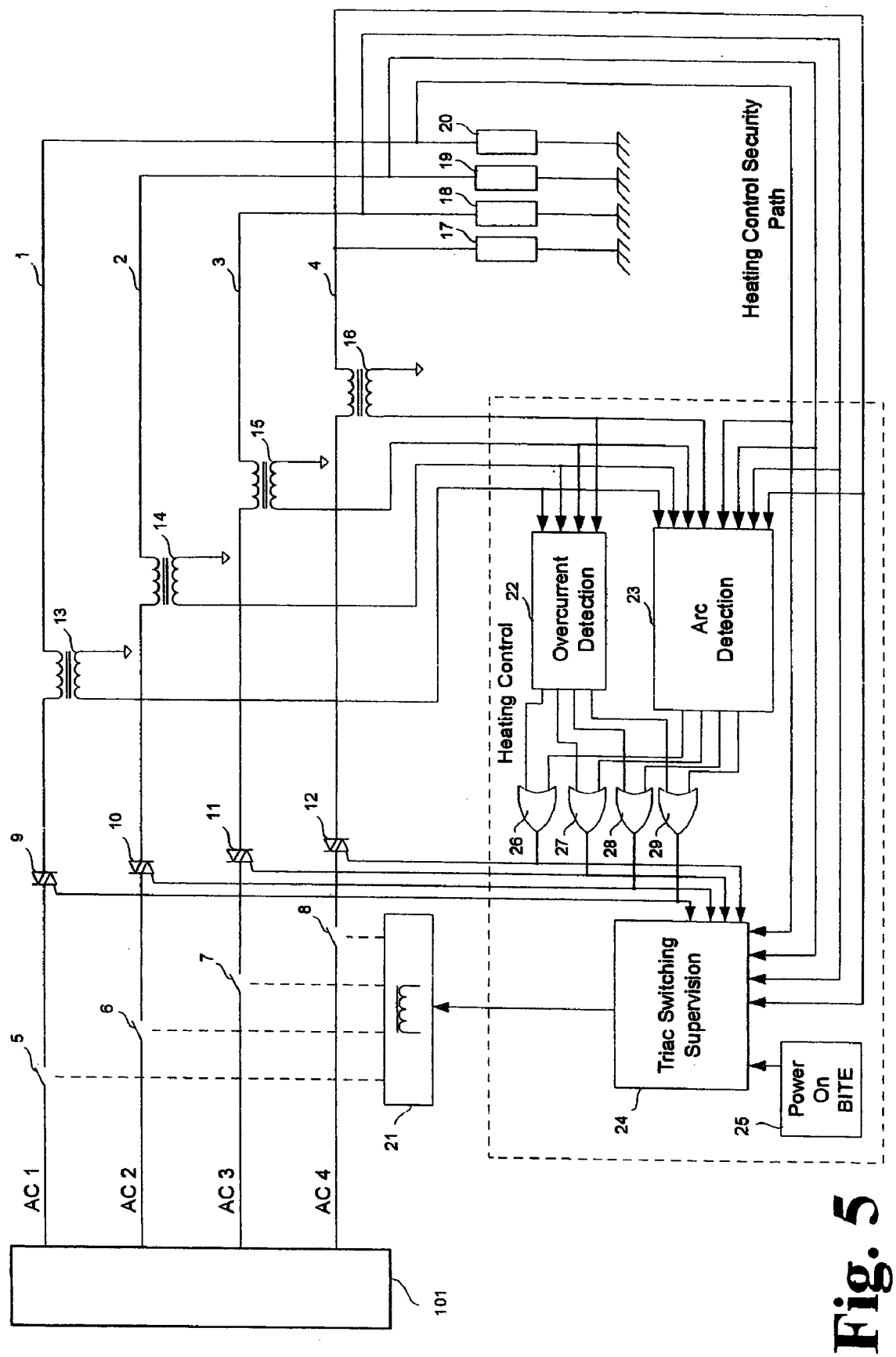
FIG. 5 shows an application example for four heating circuits in an aircraft.

In FIG. 5, in an application example for heating circuits in aircraft, the currents are measured in four lines 1 to 4 with current sensors 13 to 16, each of which is connected to an electric load (in this case, heating loads 17 to 20). Current transformers are used as current sensors 13 to 16. The heating loads 17 to 20 are supplied by four partially different AC voltages AC1 to AC4 via four lines 1 to 4, four electronic relays 9 to 12, and four electromechanical relays 5 to 8 and 21. These analog current signals and the voltage signals are sampled simultaneously in the function module 23 (arc detection) according to the invention and then processed corresponding to the described method for detection of arc tracking. For this purpose, this function module 23 is constructed as an FPGA or ASIC and can also contain the analog-to-digital converters 106 and 107, overcurrent switch 22, and electronic switching functions (e.g., control block 24). When arcing is detected through the change in the ratio of voltage to current, e.g., in lines 4, the function module sends a signal to the associated OR-gate 29 so that the electronic relay 12 arranged downstream of the latter disconnects the power supply 101 from the connected line 4 and, therefore, from the load 20. This prevents further damage (e.g., cable fire) due to arcing.

In this embodiment example, the overcurrent switch 22 (overcurrent detection) monitors the currents, in addition. An overcurrent detection is carried out in the overcurrent switch 22 by comparators known, per se, from the prior art. If overcurrent is detected, for example, in line 2, the line 2 is disconnected from the power supply 101 by the OR-gate 27 and the electronic switch 10.

For greater security, the control block 24 (triac switching supervision) trips the electromechanical relays 5 to 8 and 21 in case the electronic relays 9 to 12 do not react to their cutoff signal and, therefore, the measured voltage is not zero.

A testing of relays 5 to 9 and 21 can be commanded by block 25 ("Power On BITE").

Blocks 22, 24, 25 and the OR-gates 26 to 29 can likewise be realized in the function module (FPGA or ASIC) as can the digital processing part of the function module 23 (arc detection).

Since the arrangements and method described herein offer excellent detection of arcing when relatively constant electrical loads are used and do not lead to fault reports during voltage fluctuations, they are particularly suitable for arc tracking detection in aircraft.

However, lines of other electric circuits with any loads whose resistance does not change or changes only gradually can be protected against arc tracking by the method and arrangement described herein.

While the forgoing description and drawings represent the present invention, it will be obvious to those skilled in the art that various changes may be made therein without departing from the true spirit and scope of the present invention.

REFERENCE NUMBERS

AC1 to AC4 AC voltages
1 to 4 lines
5 to 8 electromechanical relays
9 to 12 electronic relays
13 to 16 current transformers
17 to 20 heating loads
21 electromechanical relay
22 overcurrent detector
26 to 29 OR-gates
23 function module (arc detector)
24 control block
25 "Power On BITE" block
101 power supply
102 switch
103 current sensor
104 line
105 load
106 analog-to-digital converter
107 analog-to-digital converter
111 division element (quotient former)
112 threshold evaluation unit
113 gate circuit
114 comparator
115 control unit (for power supply)
116 counter
117 up/down counter
118 calculation unit (for dynamic threshold)
200 signal pre-processing block
201, 202 offset balancing units
203, 204 low-pass (filter)
205 phase compensation unit
206, 207 absolute value unit
208 hold element
209, 210 signal pre-processing unit

What is claimed is:

1. A method for detecting fault current arcing in which a current is measured in at least one line of a load circuit and a monitoring signal is generated using a converted current measurement value, wherein arcing is detected when at least one threshold defined for the monitoring signal is exceeded in the load circuit, characterized by the following steps:
   measuring a voltage value simultaneous with the current measurement;
   forming a ratio from current measurements and voltage measurements detected in parallel; and
   generating an indicator signal for arcing when changes in the ratio of the current measurements and voltage measurements exceed predetermined threshold values.

2. The method according to claim 1, wherein the resistance value of the load circuit is formed as a ratio of the current measurements and voltage measurements.

3. The method according to claim 1, wherein the conductance of the load circuit is formed as a ratio of the current measurement value and voltage measurement values.

4. The method according to claim 1, wherein the quantity of times that the predetermined threshold of the ratio of the current measurement values and voltage measurement values is exceeded over defined time intervals is added before an arcing fault signal is generated.

5. The method according to claim 4, wherein a counter is incremented by one every time the predetermined threshold values are exceeded and is reset to zero at regular time intervals.

6. The method according to claim 5, wherein the time interval for an at least partial decrementation of the counter is between one tenth of a millisecond and ten seconds.

7. The method according to claim 5, wherein the time interval for an at least partial decrementation of the counter is between one and one-thousand half-waves of an AC voltage of the load circuit.

8. The method according to claim 4, wherein a counter is incremented when the predetermined threshold value is exceeded and is decremented by one after defined time intervals, wherein it is not further decremented when the counting value is zero.

9. The method according to claim 8, wherein the counter is incremented when the predetermined threshold is exceeded and is decremented by one after defined time intervals which have elapsed without incrementation.

10. The method according to claim 8, wherein the time interval for an at least partial decrementation of the counter is between one tenth of a millisecond and ten seconds.

11. The method according to claim 8, wherein the time interval for an at least partial decrementation of the counter is between one and one-thousand half-waves of an AC voltage of the load circuit.

12. The method according to claim 4, wherein a counter is incremented in AC circuits when the threshold value for the current-to-voltage ratio is exceeded only when a voltage amount above a predetermined voltage threshold is measured simultaneously within a half-wave of the AC voltage.

13. The method according to claim 12, wherein the counter is decremented by at least one counting value when the threshold for the current-to-voltage ratio is exceeded and the predetermined voltage threshold is not reached within a half-period.

14. The method according to claim 1, wherein offset errors of the measured current signals and voltage signals are eliminated before the ratio of the current values and voltage values is formed by subtracting a mean value determined in a currentless state of the load circuit.

15. The method according to claim 1, wherein a low-pass filtering of the current signals and voltage signals is carried out before forming the ratio of the current values and voltage values.

16. The method according to claim 1, wherein a phase compensation between current signals and voltage signals is carried out in AC voltage operated load circuits prior to forming the ratio of the current values and voltage values.

17. The method according to claim 1, wherein the absolute amounts of current signals and voltage signals are formed in AC voltage operated load circuits prior to forming the ratio of the current values and voltage values.

18. The method according to claim 1, wherein in AC voltage operated load circuits the ratio of current values and voltage values is formed from temporarily stored measurement values when the absolute value of the AC voltage of the load circuit does not exceed a predetermined threshold value, wherein the temporarily stored current values and voltage values represent the last signal state before the threshold voltage was not reached and are replaced by actual current values and voltage values only after the threshold voltage is exceeded again.

19. The method according to claim 1, wherein a constant value is used as threshold value for the evaluation of the ratio of current values and voltage values.

20. The method according to claim 1, wherein a value that is empirically determined by the user of the load circuit is used as threshold value for the evaluation of the ratio of the current values and voltage values.

21. The method according to claim 1, wherein a calculated sliding threshold value that is determined by applying a mathematical function to the continuously generated mean value of N of preceding ratio values is calculated for the evaluation of the ratio of current values and voltage values.

22. An arrangement for determining arc faults in load circuits, particularly in onboard power supplies in aircraft and spacecraft, comprising:
   a current sensor is arranged in at least one line of the load circuit;
   an analog-to-digital converter is arranged downstream of the current sensor for generating time-discrete sample values of a current signal; and
   a function unit is provided for evaluating selected sample values, for suppressing interference not caused by arcing, and for generating a fault signal when sample values are detected beyond a predetermined threshold;
   in addition to the current sensor, a voltage sensor is arranged in the line of the load circuit;
   a division element is arranged downstream of the current sensor and voltage sensor for forming ratio values from current values and voltage values that are measured simultaneously; and
   an evaluation unit is arranged downstream of the division element for generating a fault signal for detected impermissible arcing;
   said evaluation unit has at least one threshold evaluation unit for determined ratio values of current values and voltage values for generating a fault signal for detected arcing.

23. The arrangement according to claim 22, wherein the division element is connected to the current sensor and voltage sensor in such a way that the ratio value is formed from the voltage value as dividend and from the current value as divisor, and the threshold evaluation unit has, at its output, a detection signal for potential arcing when the calculated ratio value fails to reach a predetermined resistance threshold.

24. The arrangement according to claim 22, wherein the division element is connected to the current sensor and voltage sensor in such a way that the ratio value is formed from the current value as dividend and the voltage value as divisor, and the threshold evaluation unit has, at its output, a detection signal for potential arcing when the calculated ratio value exceeds a predetermined conductance threshold.

25. The arrangement according to claim 22, wherein the evaluation unit contains, downstream of the threshold evaluation unit, at least one selective summing of the detection signals of the threshold evaluation unit based on a permissible frequency of occurrence of detection signals of potential arcing within predetermined time intervals and has a fault signal for detected arcing when the permissible frequency of occurrence is exceeded.

26. The arrangement according to claim 25 wherein the evaluation unit contains at least one counter arranged downstream of the threshold evaluation unit, wherein the threshold evaluation unit has a detection signal for potential arcing when the ratio value exceeds a predetermined threshold value and is applied to an incrementing input of the counter.

27. The arrangement according to claim 26, wherein the counter has a reset input which communicates with a gate circuit so that the counting value of potential arcing is set back in defined time intervals.

28. The arrangement according to claim 26, wherein the counter is a forward/backward counter and has a decrementing input that is connected to a gate circuit so that the counter is decremented by one increment in defined time intervals.

29. The arrangement according to claim 28, wherein in an AC voltage operated circuit the gate circuit communicates with a zero crossing detector for detecting half-waves of the AC voltage and with the output of the threshold evaluation unit so that the counter is
   decremented by at least one increment after a predetermined quantity of half-waves in which no incrementation was carried out by the threshold evaluation unit.

30. The arrangement according to claim 28, wherein in AC voltage operated load circuits the gate circuit communicates with a threshold switch which has an H-signal when a voltage threshold is not reached in the zero crossing region of the AC voltage, which H-signal is conjunctively linked to the output of the threshold evaluation unit for the ratio value, so that the counter is decremented by at least one increment when there is a detection signal of the threshold evaluation unit and the H-signal of the threshold switch of the voltage threshold.

31. The arrangement according to claim 26, wherein in an AC voltage operated circuit the gate circuit communicates with a zero crossing detector for detecting half-waves of the AC voltage so that the counter is decremented by at least one increment after a predetermined quantity of half-waves.

32. The arrangement according to claim 22, wherein there is a digital signal pre-processing unit between the current sensor and voltage sensor and the division element having at least one of the following components: offset balancing unit, low-pass filter, phase compensation unit, absolute value unit, hold element.

33. The arrangement according to claim 22, wherein at least the division element and the evaluation unit are integrated on an FPGA.

34. The arrangement according to claim 33, wherein additional elements, particularly current sensors and voltage sensors and a signal pre-processing unit arranged in front of the division element, are integrated on a circuit in addition to the division element and evaluation unit.

35. The arrangement according to claim 22, wherein at least the division element and the evaluation unit are integrated on an ASIC.

36. The arrangement according to claim 22, wherein an electric switch is arranged in the monitored line of the load circuit near the power supply and is provided for interrupting the connection to the power supply when the evaluation unit has a fault signal for detected arcing.

37. The arrangement according to claim 36, wherein a solid state switch is used as switch.

38. The arrangement according to claim 36, wherein an electromagnetic relay is used as switch.

39. The arrangement according to claim 22, wherein the current sensor with associated analog-to-digital converter, the voltage sensor in the form of the analog-to-digital converter, and a function module containing the division element and the evaluation unit are integrated in a compact protection switch whose switching function disconnects the monitored line from the power supply when the evaluation unit generates the fault signal.

* * * * *